US009283935B2

(12) United States Patent
Fujioka

(10) Patent No.: US 9,283,935 B2
(45) Date of Patent: Mar. 15, 2016

(54) RAIL GUIDED VEHICLE SYSTEM

(75) Inventor: Shinji Fujioka, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 180 days.

(21) Appl. No.: 13/984,514

(22) PCT Filed: Dec. 6, 2011

(86) PCT No.: PCT/JP2011/078161
§ 371 (c)(1),
(2), (4) Date: Oct. 22, 2013

(87) PCT Pub. No.: WO2012/108098
PCT Pub. Date: Aug. 16, 2012

(65) Prior Publication Data
US 2014/0034786 A1    Feb. 6, 2014

(30) Foreign Application Priority Data

Feb. 9, 2011    (JP) ................................ 2011-026070

(51) Int. Cl.
| | |
|---|---|
| *B60T 8/17* | (2006.01) |
| *H01L 21/677* | (2006.01) |
| *B61B 3/02* | (2006.01) |
| *B61B 13/04* | (2006.01) |
| *E01B 7/00* | (2006.01) |

(52) U.S. Cl.
CPC ................ *B60T 8/1705* (2013.01); *B61B 3/02* (2013.01); *B61B 13/04* (2013.01); *E01B 7/00* (2013.01); *H01L 21/67715* (2013.01); *H01L 21/67724* (2013.01); *H01L 21/67727* (2013.01); *H01L 21/67733* (2013.01)

(58) Field of Classification Search
CPC ........... B61L 3/00; B61L 3/002; B61L 3/004; B61L 3/02; B61L 7/00; B61L 7/02; B61L 15/00; B61L 15/0009; B61L 15/0018; B61L 25/00; B61L 25/02

USPC ...... 246/122 R–124, 167 R, 176–178, 182 R, 246/184
See application file for complete search history.

(56) References Cited

U.S. PATENT DOCUMENTS

| | | | | |
|---|---|---|---|---|
| 8,104,722 | B2 * | 1/2012 | Onishi ...................... | 246/122 R |
| 2009/0063052 | A1 * | 3/2009 | Onishi .......................... | 701/301 |

FOREIGN PATENT DOCUMENTS

| | | |
|---|---|---|
| JP | 50-000373 | 1/1975 |
| JP | 61-103217 | 5/1986 |

(Continued)

OTHER PUBLICATIONS

Japanese language international preliminary report on patentability dated Aug. 22, 2013 and its English language translation issued in corresponding PCT application PCT/JP2011/078161.

*Primary Examiner* — R. J. McCarry, Jr.
(74) *Attorney, Agent, or Firm* — DLA Piper LLP (US)

(57) ABSTRACT

In a rail guided vehicle system, unnecessary slowing down and stopping of a vehicle passing through a divergence point and a merge point is avoided. The rail guided vehicle system comprises a rail 100 including a guidepath wire 600 in a predetermined area including the divergence point and the merge point, and a plurality of vehicles 200 that travel while being supported and guided by the rail. Each of the plurality of vehicles 200 includes a generating unit 910, 920 configured to generate each of a plurality of signals each having different frequencies from the others, a transmitting unit 810, 820 configured to send each of the plurality of signals generated by the generating unit to the guidepath wire, a receiving unit 710, 720 configured to receive each of the plurality of signals transmitted via the guidepath wire, a determining unit 955 configured to determine, based on the kind of the signal received by the receiving unit, whether the vehicle is slowed down, stopped, or kept travelling, and a controlling unit 960 configured to control the vehicle in accordance with a result of a determination determined by the determining unit.

10 Claims, 13 Drawing Sheets

(56) References Cited

FOREIGN PATENT DOCUMENTS

| JP | 03-017712 | 1/1991 |
| JP | 2000-250627 | 9/2000 |
| JP | 2005-115590 | 4/2005 |
| JP | 3985320 | 7/2007 |
| JP | 2007-226835 | 9/2007 |
| JP | 2009-009440 A | 1/2009 |

* cited by examiner

RAIL GUIDED VEHICLE SYSTEM

CROSS REFERENCE TO RELATED APPLICATIONS

This application is a national stage of international application PCT/JP2011/078161, filed on Dec. 6, 2011, and claims the benefit of priority under 35 USC 119 of Japanese application 2011-0260770, filed on Feb. 9, 2011, which are incorporated herein by reference.

TECHNICAL FIELD

This invention relates to a technical field of a rail guided vehicle system that conveys along a rail a thing to be conveyed such as, for example, a container that contains various kinds of substrates, etc., for fabricating a semiconductor apparatus.

BACKGROUND ART

For this kind of a rail guided vehicle system, a system having a suspension-type vehicle that conveys a thing to be conveyed such as a Front Opening Unified Pod (FOUP), etc., by travelling on a rail installed on a ceiling has been known. In such a rail guided vehicle system, a collision-avoidance system may be installed in order for the vehicles not to collide with each other at a divergence point and a merge point of the rail. For example, in Patent Citations 1 through 3, techniques are described to avoid the collision and to allow the vehicles to recognize each other by allowing the vehicles to communicate with each other via a guidepath wire arranged in the vicinity of the divergence point and the merge point.
Patent Citation 1: Japanese Patent No. 3985320
Patent Citation 2: Japanese Laid-Open Patent Application No. 2003-264216
Patent Citation 3: Japanese Patent No. 4241306

DISCLOSURE OF INVENTION

Technical Problem

However, in the techniques according to Patent Citations 1 through 3 as described above, each vehicle sends and receives signals having a single frequency. Thus, in a place where the divergence points and the merge points are continuously arranged, when the vehicle enters from one guidepath wire area to the next guidepath wire area, it is required that the vehicle is slowed down enough for the case where the vehicle receives signals in the next guidepath wire area (namely, the case where the other preceding vehicle is travelling in the next guidepath wire area). Therefore, the vehicle is excessively slowed down and stopped in the place where the divergence points and the merge points are continuously arranged. Such slowing down and stopping hinder the vehicle from effectively travelling, which results in lowering an efficiency of conveying in the system.

The problem to be solved by the present invention is to provide a rail guided vehicle system that can suppress unnecessary slowing down and stopping of the vehicle passing through the divergence point and the merge point, in view of the above-described problem.

Technical Solution

In the below, a plurality of aspects as means to solve the problem will be explained. These aspects can be combined arbitrarily in accordance with the requirements.

A rail guided vehicle system according to one aspect of the present invention is a rail guided vehicle system comprising a rail having a guidepath wire in a predetermined area including a divergence point and a merge point and a plurality of vehicles that travel while being supported and guided by the rail. Each of the plurality of vehicles comprises a generating unit, a transmitting unit, a receiving unit, a determining unit, and a controlling unit. The generating unit is configured to generate a plurality of signals each having different frequencies from the others. The transmitting unit is configured to transmit each of the plurality of signals generated by the generating unit to the guidepath wire. The receiving unit is configured to receive each of the plurality of signals transmitted via the guidepath wire. The determining unit is configured to determine, based on the kind of the signal received by the receiving unit, whether the vehicle is to be slowed down, or stopped or kept travelling. The controlling unit is configured to control the vehicle in accordance with a result of a determination determined by the determining unit.

This rail guided vehicle system comprises a rail that is installed, for example, on a ceiling, in the vicinity of a ceiling, or on the ground, and vehicles that travel while being supported and guided by the rail. A plurality of the vehicles are arranged on the rail. Each vehicle comprises, for example, a travelling unit configured to travel on the rail and a main body unit attached to the travelling unit and configured to carry a thing to be conveyed such as FUOP, a reticle, and etc. When the rail guided vehicle system of the present invention is in operation, the conveying of the thing to be conveyed that is loaded on the vehicle is realized by allowing the vehicles to travel along the rail.

The rail, in particular, has a plurality of the divergence points and the merge points. Then, a guidepath wire that can transmit any kinds of signals is arranged in a predetermined area that includes the divergence point and the merge point. It should be noted that "the predetermined area" described here means an area where the vehicle about to pass through the divergence point and the merge point should recognize the existence of other vehicles in order to avoid colliding with the other vehicles. A plurality of the predetermined areas are set so as to correspond to each of the divergence points and the merge points.

On the other hand, the vehicle according to the present invention comprises a generating unit for generating each of the plurality of signals each having different frequencies from the others, a sending unit for sending each of the plurality of signals generated by the generating unit, and a receiving unit for receiving each of a plurality of the signals transmitted via the guidepath wire. Therefore, each vehicle can send to the guidepath wire the signals that are generated by the generating unit and can allow the receiving unit of the other vehicles to receive the signals transmitted via the guidepath wire. Namely, the vehicles can communicate with each other via the guidepath wire in the predetermined area where the guidepath wire is arranged. According to the present invention, in particular, the generating unit can generate the plurality of signals each having different frequencies from the others and therefore a plurality of information (namely, information in accordance with the number of the signals) can be transmitted using one guidepath wire.

The vehicle further comprises the determining unit configured to determine, based on the kind of the signal received by the receiving unit, whether the vehicle is to be slowed down, or stopped or kept travelling, and the controlling unit configured to control the vehicle in accordance with the result of the determination determined by the determining unit. The determining unit recognizes, based on the received signal, for example, travelling positions, travelling statuses, and kinds (for example, whether the vehicle is an express vehicle or a vehicle for a normal travelling, etc.) of the other vehicles, and determines a travelling control to be realized by the vehicle using the recognized information. Then, the travelling control of the vehicle is performed by the controlling unit in accordance with the result of the determination determined by the determining unit. Thus, the effective travelling can be realized while preventing the vehicles from colliding with each other at the divergence point and the merge point.

Here, if each vehicle can receive only one signal (namely, a signal with a single frequency), it will be difficult, in the place where the divergence points and the merge points are arranged continuously, to recognize each of the statuses of the divergence points and the merge points. For example, when the vehicle passes through one merge point, it will be impossible to recognize the existence of the other vehicles at the other merge points arranged immediately after the merge point. Therefore, when the vehicle enters from one merge point to the other, it will be required for the vehicle to slow down for the case where the preceding other vehicle exists. Therefore, each vehicle is excessively slowed down and stopped in the place where the divergence points and the merge points are arranged continuously.

On the other hand, according to the present invention, in particular, as described above, each vehicle can generate a plurality of signals each having different frequencies from the others. Thus, it is possible, even in the place where the divergence points and the merge points are arranged continuously, to recognize the travelling statuses of other vehicles at a plurality of the divergence points and the merge points by sending and receiving the signals that correspond to each divergence point and each merge point. Specifically, when the vehicle passes through one merge point, the vehicle can recognize the status of the next merge point. Therefore, it is possible to avoid unnecessary slowing down and stopping of the vehicle passing through the divergence point and the merge point.

According to one aspect of the rail guided vehicle system of the present invention, when the vehicle passes through the divergence point and the merge point, the generating unit is configured to generate the kind of the signal that is inherently allocated to each of the divergence point and the merge point.

According to this aspect, the kind of the signal to be transmitted is inherently allocated to each of the divergence point and the merge point in advance. Therefore, each vehicle selects the signal in accordance with the divergence point and the merge point to be passed from the plurality of signals that can be transmitted and sends the selected signal. More specifically, each vehicle has, for example, map information of the rail (namely, the information showing the positions of the divergence points and the merge points) and selects the signal to be transmitted based on the travelling position of the vehicle and the map information.

With such a structure, the following vehicle can reliably recognize at which divergence point or merge point the preceding vehicle is travelling. Namely, the travelling position of the preceding vehicle can easily and reliably be recognized. Therefore, the following vehicle can travel just before the divergence point and the merge point where the preceding vehicle is travelling, without slowing down or stopping.

According to another aspect of the rail guided vehicle system of the present invention, the receiving unit is arranged at the front end side of the vehicle and the transmitting unit is arranged at the back end side of the vehicle.

According to this aspect, since the receiving unit is arranged at the front end side of the vehicle, the vehicle can receive the signals soon after entering to the predetermined area where the guidepath wire is arranged. Therefore, it is possible to recognize extremely quickly the existence of other vehicles travelling in the predetermined area.

In addition, according to this aspect, since the transmitting unit is arranged at the back end side of the vehicle, the vehicle can transmit the signals until the vehicle moves almost completely out of the predetermined area. Therefore, it is possible to allow reliably other vehicles travelling in the predetermined area to recognize that the vehicle is in the predetermined area.

It should be noted that it is acceptable that the receiving unit is arranged at the position as close to the front end as possible and the transmitting unit is arranged at the position as close to the back end as possible in order to obtain the effect described above. However, as long as the receiving unit is arranged at the position closer to the front end than the transmitting unit, the effect of this aspect can be obtained.

According to the above-described aspect in which the receiving unit is arranged at the front end side of the vehicle and the transmitting unit is arranged at the back end side of the vehicle, the guidepath wire is arranged along at least one of a right side frame and a left side frame of the rail, the receiving unit includes a first receiving unit arranged at a right-front end side of the vehicle and a second receiving unit arranged at a left-front end side of the vehicle, and the transmitting unit includes a first transmitting unit arranged at the right-back end side of the vehicle and a second transmitting unit arranged at the left-back end side of the vehicle.

According to this aspect, each vehicle has the first receiving unit arranged at the right-front end side of the vehicle and the second receiving unit arranged at the left-front end side of the vehicle, and has the first transmitting unit arranged at the right-back end side of the vehicle and the second transmitting unit arranged at the left-back end side of the vehicle. Therefore, it is possible to transmit preferably the signals to each guidepath wire arranged along at least one of the right side frame and the left side frame of the rail and receive the signals transmitted via a guidepath wire. Namely, the first receiving unit and the first transmitting unit are used for the guidepath wire arranged along the right side frame of the rail and the second receiving unit and the second transmitting unit are used for the guidepath wire arranged along the left side frame of the rail.

According to the above-described structure, it is possible to transmit preferably the signals to a plurality of the guidepath wires and receive preferably the signals from a plurality of the guidepath wires. Therefore, it is possible to recognize preferably each of the travelling statuses of other vehicles travelling at a plurality of the divergence points and the merge points.

According to another aspect of the rail guided vehicle system of the present invention, the generating unit is configured to generate an emergency stop signal as one of the plurality of signals, the determining unit is configured to determine, when the receiving unit receives the emergency stop signal, that the vehicle is to be brought to an emergency stop, and the controlling unit is configured to control, when it is determined that the vehicle is to be brought to the emergency stop, the vehicle so as to bring the vehicle to the emergency stop.

According to this aspect, the emergency stop signal is generated by the generating unit as one of the plurality of signals. The emergency stop signal generated from one vehicle is transmitted by the transmitting unit to the guidepath wire and is received by the receiving unit of other vehicles.

The vehicle that receives the emergency stop signal is controlled so as to bring the vehicle to the emergency stop.

With the emergency stop signal, when the other vehicles exit in the same guidepath wire area, or when there are other vehicles about to enter to the same guidepath wire area, it is possible to bring all of such other vehicles to the emergency stop. Thus, it is possible to prevent further reliably the vehicles from interfering and colliding with each other.

The effects and merits of the present invention will be clarified from the embodiments explained next.

Figure 1:
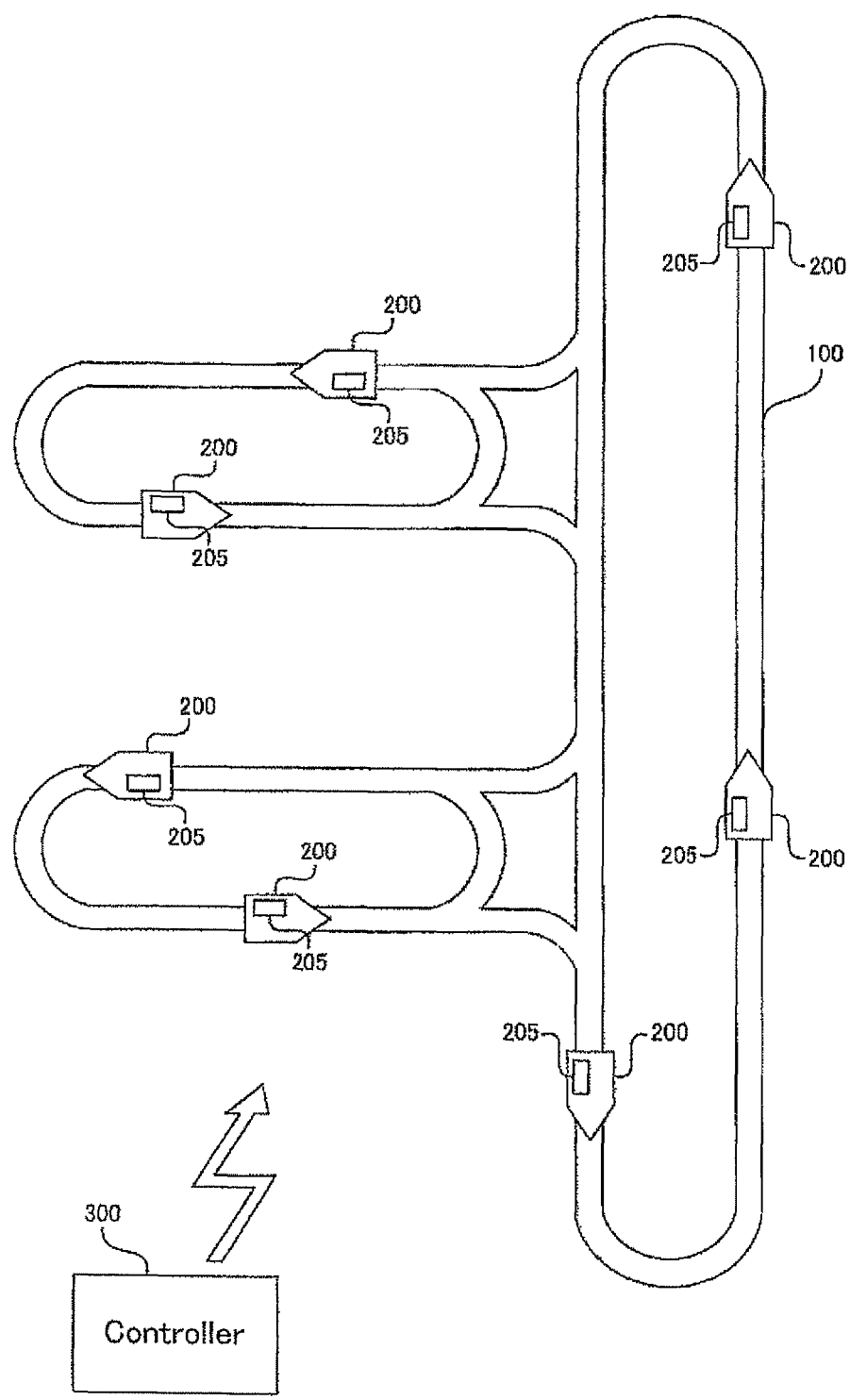
FIG. 1 is a top plan view showing an entire structure of a rail guided vehicle system.

EXPLANATION OF REFERENCE 100 rail
101 main rail
102 first divergence rail
103 second divergence rail
104 main rail
105 first merge rail
106 second merge rail
107 first rail
108 second rail
109 first connecting rail
110 second connecting rail
151-158 stop mark
200-200i vehicle
205 on-board controller
210 travelling unit
215 travelling roller
220 main body unit
230 moving unit
235 hoist unit
240 hoist belt
250 gripping unit
300 controller
400 FOUP
510 port
520 side buffer
600-610 guidepath wire
710 first receiving coil
720 second receiving coil
810 first transmitting coil
820 second transmitting coil
900 communication circuit
910 first generating circuit
915 first signal transmitting unit
920 second generating circuit
925 second transmitting unit
930 first receiving circuit
935 first receiving unit
940 second receiving circuit
945 second receiving unit
950 memory unit
955 guidepath wire control unit
960 travelling control unit Embodiment (1) Entire Structure The embodiment of the present invention will be explained below, referring to the figures.

First, the entire structure of a rail guided vehicle system according to this embodiment will be explained, referring to FIG. 1. FIG. 1 is a top plan view showing the entire structure of the rail guided vehicle system.

In FIG. 1, the rail guided vehicle system according to this embodiment comprises a rail 100, a plurality of vehicles 200, and a controller 300.

The rail 100 is arranged on, for example, a ceiling and made of metal such as aluminum, stainless steel, and etc. The rail 100 according to this embodiment includes specifically a plurality of merge points and divergence points. In addition, a guidepath wire, which is omitted from the figure, is arranged in the rail 100.

A plurality of vehicles 200 are arranged on the rail 100 and can convey a FOUP to be conveyed by travelling along the rail 100.

In addition, each of the vehicles 200 includes an on-board controller 205. The on-board controller 205 receives a conveying instruction from a controller 300 and controls travelling of the vehicle 200. It should be noted that the on-board controller 205 not only controls travelling of the vehicle 200 but also has a function of controlling whole apparatuses included in the vehicle 200.

A front monitoring sensor, which is not shown in the figure, is further arranged in the vehicle 200. This front monitoring sensor scans the front of the vehicle 200 and detects optically an obstacle (other vehicles or a person or a thing in the travelling route) in the predetermined detection range (specifically in the predetermined distance and the predetermined width). It should be noted that the predetermined distance means the distance in longitudinal direction (namely, the longitudinal direction of the rail) in which the vehicle 200 can certainly stop when the vehicle 200 detects the obstacle. It should also be noted that the predetermined width means the width slightly (for example, a few centimeters or so) wider than the width of the vehicle 200. The detection range is set so as not to detect a temporary storing shelf for the FOUP or any structures which may be located in the vicinity of the travelling route of the vehicle 200 as the obstacle.

When the obstacle is detected, the front monitoring sensor sends a detection signal to the on-board controller 205. The on-board controller 205 receiving the detection signal controls the vehicle 200 so that the vehicle 200 is slowed down or stopped.

The controller 300 includes an arithmetic circuit, a memory, and etc. and is configured to give the conveying instruction to the vehicle 200 via the on-board controller 205.

Although not shown in the figure, it should be noted that a shelf (for example, a buffer, a port, and etc.) storing the FOUP temporarily and a semiconductor fabricating apparatus are arranged in the location along the rail 100.

(2) Detailed Structure of a Vehicle

Figure 2:
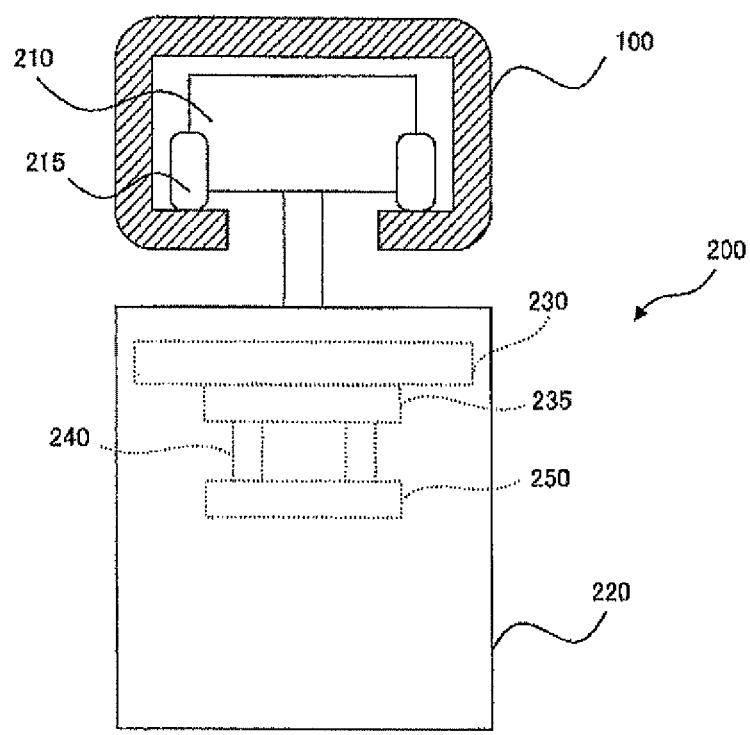
FIG. 2 is a side view showing an structure of a vehicle.

Next, the further detailed structure of the vehicle 200 will be explained, referring to FIG. 2. FIG. 2 is a side view showing the structure of the vehicle. It should be noted that, for the convenience of the explanation, a member for communicating with the guidepath wire is omitted from FIG. 2.

In FIG. 2, the vehicle 200 includes a travelling unit 210, a main body unit 220, a moving unit 230, a hoist unit 235, a hoist belt 240, and a gripping unit 250.

The vehicle 200 travels along the rail 100 while running rollers 215 are rolled by using the driving power which the travelling unit 210 gives with, for example, a linear motor and etc. The main body unit 220 is suspended on the bottom plane of the travelling unit 210.

The moving unit 230 is attached to the main body unit 220. The moving unit 230 can move to the side (namely, the right and left directions in the figure) of the rail 100. The hoist unit 235 is attached to the bottom plane of the moving unit 230.

The gripping unit 250 that grips the FOUP is attached to the bottom plane of the hoist unit 235 with the hoist belt 240. The gripping unit 250 can ascend or descend relative to the main body unit 220 by winding off or reeling the hoist belt 240.

Figure 3:
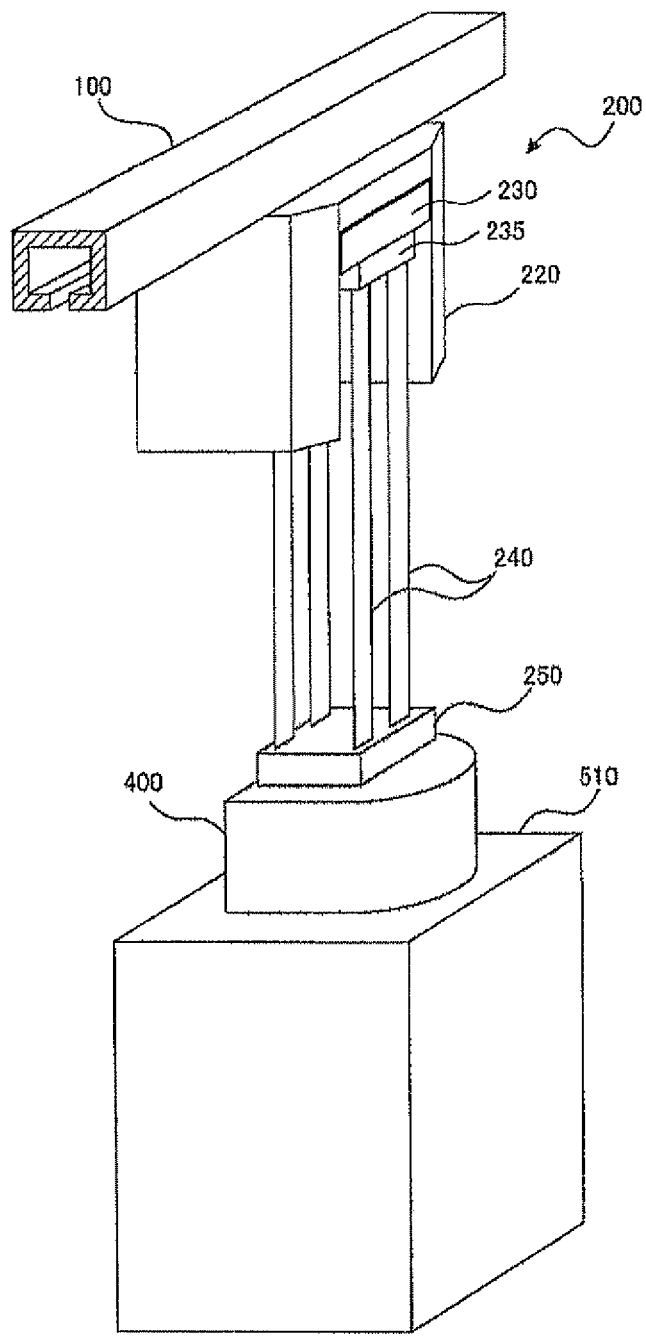
FIG. 3 is a perspective view showing a transferring operation of a vehicle.
Figure 4:
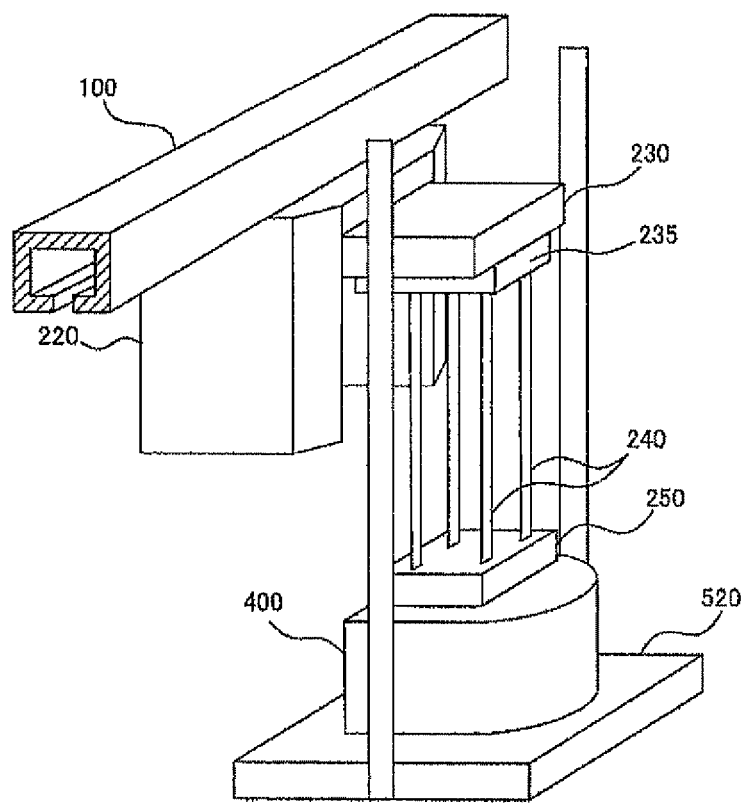
FIG. 4 is a perspective view showing a lateral transferring operation of a vehicle.

Next, the method of transferring the FOUP by the vehicle will be explained, referring to FIGS. 3 and 4. FIGS. 3 and 4 are perspective views showing the method of transferring the FOUP by the vehicle according to the embodiment.

In FIG. 3, when the vehicle 200 transfers the FOUP 400 on the port 510 located right below the rail 100, the vehicle 200 first travels on the rail 100 and stops over the FOUP 400 arranged on the port 510. Then, the position between the gripping unit 250 and the FOUP 400 is finely adjusted.

Next, as shown in the figure, the hoist belt 240 is wound off by the hoist unit 235 and the gripping unit 250 descends to the location of the FOUP 400. The gripping unit 250 that is descended grips the FOUP 400.

When the FOUP 400 is gripped, the hoist belt 240 is reeled and the gripping unit 250 and the FOUP 400 that is gripped ascend to the location of the main body unit 220. Then, the vehicle 200 travels again on the rail and the FOUP 400 is conveyed.

In FIG. 4, when the FOUP 400 is arranged at a side buffer 520 located off the side of the rail 100, after the moving unit 230 moves to the side of the rail 100, the hoist belt 240 is wound off by the hoist unit 235 and the gripping unit 250 descends to the location of the FOUR 400. With such an operation, it is possible to perform a lateral transfer of the FOUP 400 from the rail 100.

Figure 5:
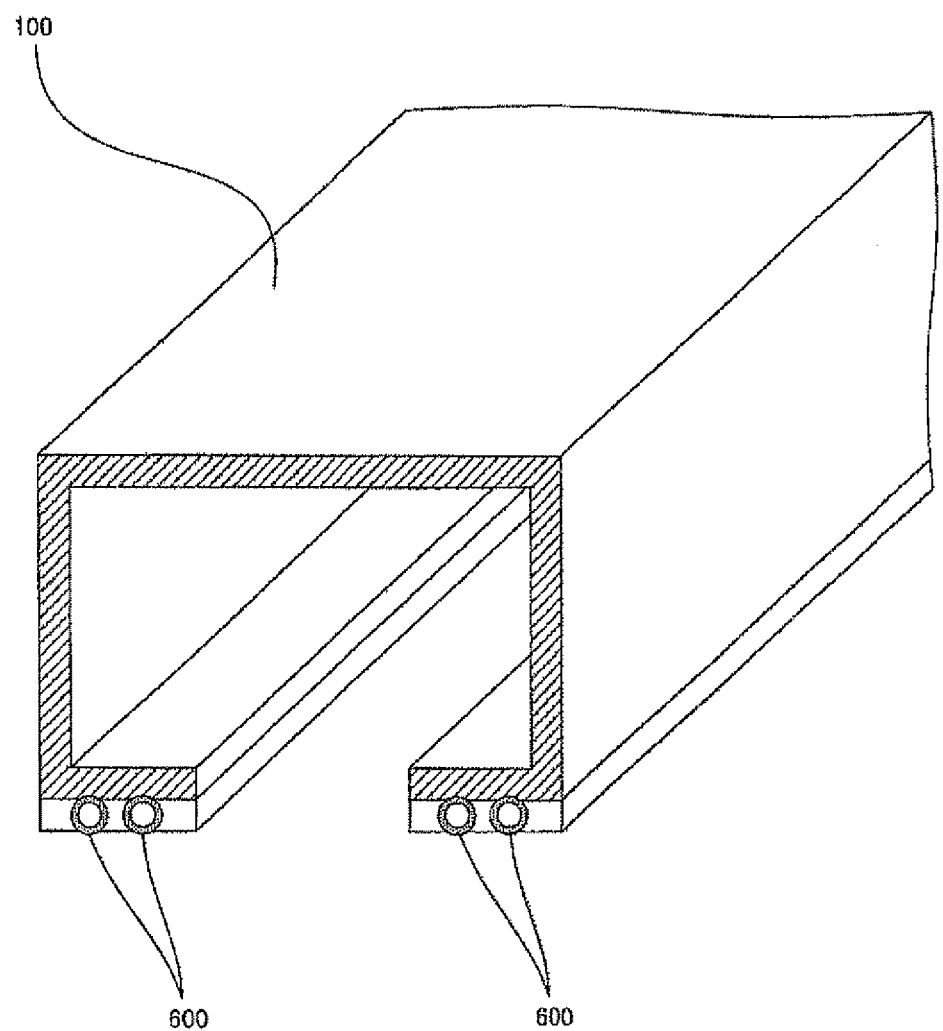
FIG. 5 is a cross sectional view showing an arranging position of a guidepath wire in a rail.
Figure 6:
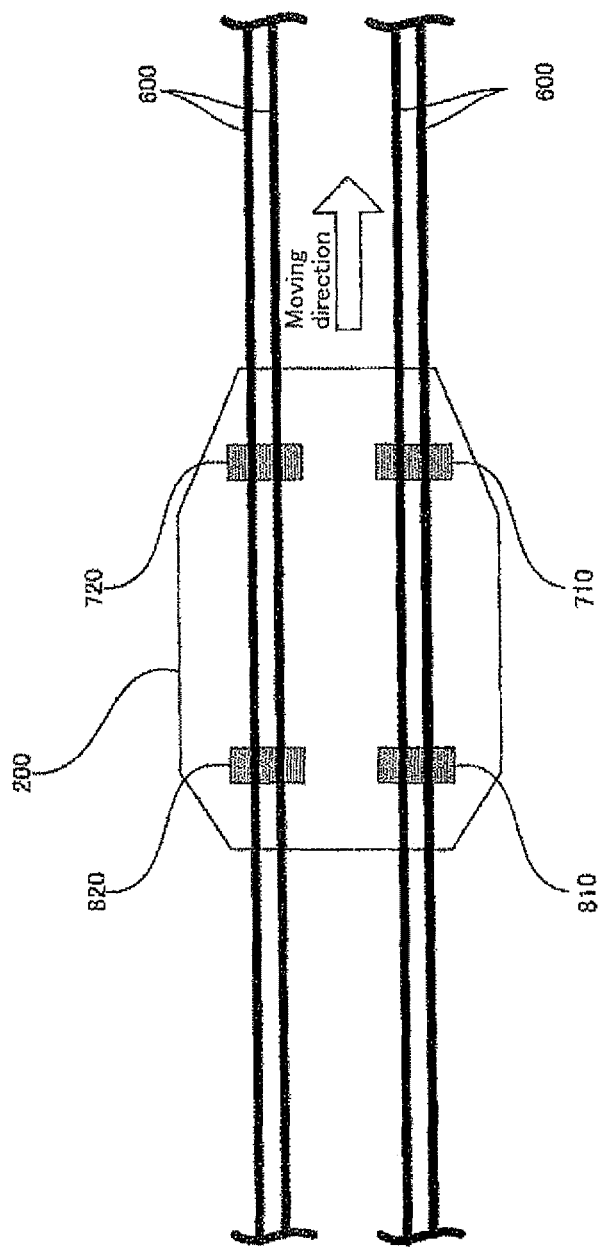
FIG. 6 is a top plan view showing a structure that realizes a communication between a vehicle and a guidepath wire.
Figure 7:
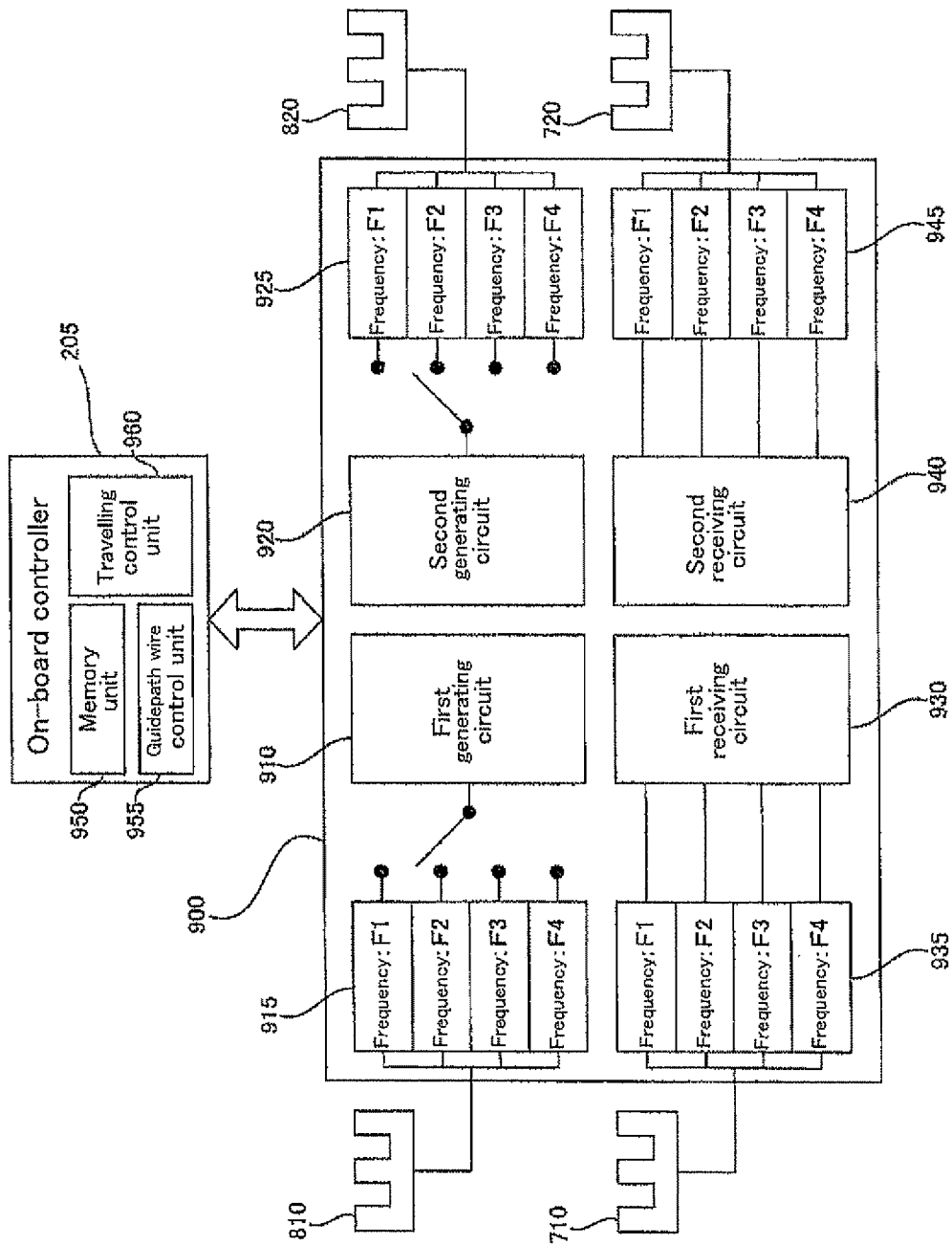
FIG. 7 is a block diagram showing a structure of a communication circuit of a vehicle.

(3) The Structures of a Guidepath Wire and a Vehicle Realizing a Communication Via the Guidepath Wire Next, the structures of the guidepath wire and the vehicle realizing a communication via the guidepath wire, which are unique features of this embodiment, will be explained, referring to FIGS. 5 though 7. FIG. 5 is a cross sectional view showing the arranging position of the guidepath wire in the rail. FIG. 6 is a top plan view showing the structure that realizes the communication between the vehicle and the guidepath wire. FIG. 7 is a block diagram showing the structure of a communication circuit of the vehicle.

In FIG. 5, in the rail 100 according to this embodiment, guidepath wires 600 are arranged in the predetermined area including the divergence points and the merge points. The guidepath wire 600 is, for example, a looped conduction line and arranged at the lower plane (namely, the plane facing the vehicle) side of the rail 100. It should be noted that, while the guidepath wires 600 are arranged along the right side frame and the left side frame of the rail 100 in FIG. 5, there may be an area where the guidepath wire 600 is arranged along only one frame.

In FIG. 6, a first receiving coil 710 and a first transmitting coil 810 are arranged in the vehicle 200 so as to correspond to the guidepath wire 600 at the right side of the rail 100. The first receiving coil 710 receives a signal transmitted via the guidepath wire 600. On the other hand, the first transmitting coil 810 transmits a signal to the guidepath wire 600. The first receiving coil 710 is arranged closer to the front end side of the vehicle 200 than the first transmitting coil 810.

A second receiving coil 720 and a second transmitting coil 820 are further arranged in the vehicle 200 so as to correspond to the guidepath wire 600 at the left side of the rail 100. The second receiving coil 720 receives a signal transmitted via the guidepath wire 600. On the other hand, the second transmitting coil 820 transmits a signal to the guidepath wire 600. The second receiving coil 720 is arranged closer to the front end side of the vehicle 200 than the second transmitting coil 820.

It should be noted that each of the above-described first receiving coil 710 and the second receiving coil 720 is one example of the "receiving unit". In addition, each of the first transmitting coil 810 and the second transmitting coil 820 is one example of the "transmitting unit".

In FIG. 7, a communication circuit 900 is arranged in the vehicle 200. The communication circuit 900 includes a first generating circuit 910, a first transmitting unit 915, a second generating circuit 920, a second transmitting unit 925, a first receiving circuit 930, a first receiving unit 935, a second receiving circuit 940, and a second receiving unit 945.

Each of the first generating circuit 910 and the second generating circuit 920 is one example of the "generating unit" of the present invention and is configured to generate four signals F1 through F4 each having different frequencies from the others by switching the switch arranged between the first generating circuit 910 and the first transmitting unit 915 and the switch arranged between the second generating circuit 920 and the second transmitting unit 925. The generated signal is transmitted to each of the guidepath wires 600 by the first transmitting coil 810 and the second transmitting coil 820.

Each of the first receiving circuit 930 and the second receiving circuit 940 is configured to receive the signal received by the first receiving coil 710 and the second receiving coil 720 via the first receiving unit 935 and the second receiving unit 945, respectively. It should be noted that, unlike the above-described first generating circuit 910 and the second generating circuit 920, the first receiving circuit 930 and the second receiving circuit 940 can receive four signals F1 through F4 at the same time without switching.

Each vehicle travelling on the rail 100 can recognize the existence of other vehicles 200 in the area where the guidepath wire 600 is arranged by sending and receiving the signals F1 through F4. For example, one vehicle 200 can recognize the travelling position and the travelling status of other vehicles by receiving the signals transmitted from the other vehicles 200. The vehicle 200 has, for example, map information corresponding to the divergence points and the merge points, and selects one signal inherently allocated to each of the divergence point and the merge point from four signals F1 through F4 that can be generated.

It should be noted that each signal having each frequency is outputted as a pulse string that is random or inherent to each vehicle 200. When the pulse string of the received signal matches to that of the transmitted signal from the vehicle 200, it is determined that the received signal is transmitted from the vehicle 200. On the other hand, even if the frequencies of the received signal and the transmitted signal are the same, when the pulse string of the received signal does not match up with that of the transmitted signal, it is determined that the received signal is transmitted from other vehicles. Although the vehicle 200 according to this embodiment can transmit and receive four signals, it is acceptable that more signals can be transmitted and received. In this case, although the structures of the communication circuit 900 and etc. become slightly complicated, more information can be transmitted. More specifically, more guidepath wires 600 can be connected to each other at the divergence point and the merge point and more detailed control of the guidepath wire can be realized.

The communication circuit 900 is electrically connected to the on-board controller 205 (see FIG. 1), and is configured to receive any kinds of controlling signals transmitted from the on-board controller 205 and to send results of transmitting and receiving four signals F1 through F4 to the on-board controller 205.

The on-board controller 205 includes a memory unit 950, a guidepath wire control unit 955 that is one example of the "determining unit" of the present invention, and a travelling control unit 960 that is one example of the "controlling unit" of the present invention.

The memory unit 950 stores data of the rail 100 on which the vehicle 200 travels as, for example, map data. The memory unit 950 stores, for example, the position of the divergence point and the merge point, speed limit, and etc. In addition, the memory unit 950 stores the information, regarding the control using the guidepath wire 600, on which signal should be transmitted to the guidepath wire 600 in accordance with the moving direction of the vehicle 200 at the divergence point and the merge point, and on which signal received from the guidepath wire 600 indicates slowing down or stopping of the vehicle 200.

The guidepath wire control unit 955 determines how the vehicle 200 should be controlled based on the results of receiving the signals F1 through F4. Specifically, the guidepath wire control unit 955 determines, in accordance with the information stored in the memory unit 950, which signal should be transmitted to the guidepath wire 600 at which divergence point and merge point, which received signal indicates slowing down, stopping, or continuing travelling, and then sends the determined result to the travelling control unit 960. In addition, when no signal is received (in the case when even the signal transmitted by the vehicle 200 is not received), it is determined that the guidepath wire 600 is disconnected and a disconnection signal is generated and transmitted to the travelling control unit 960. The travelling control unit 960 controls the travelling of the vehicle 200 based on the result determined in the guidepath wire control unit 955.

Figure 8:
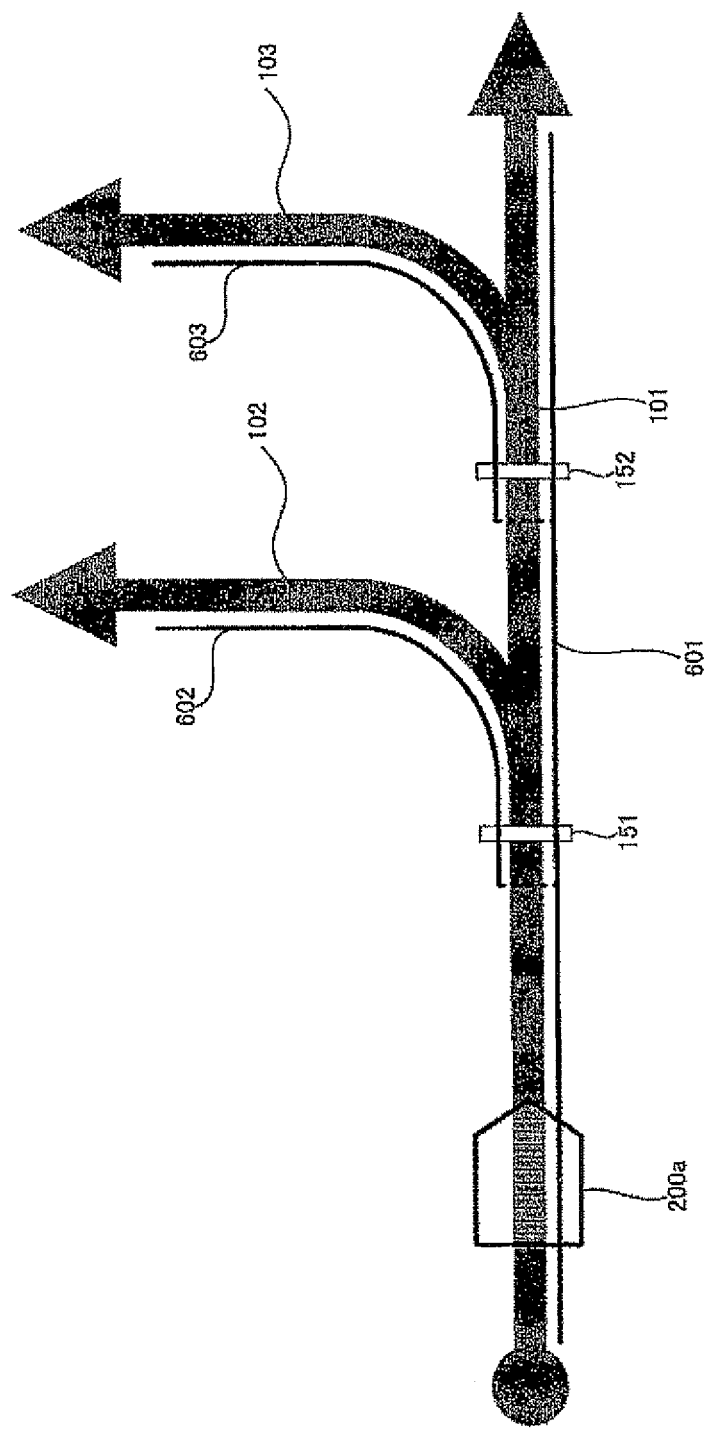
FIG. 8 is a conceptual diagram showing a structure of a guidepath wire and an operation of a vehicle according to example 1.
Figure 9:
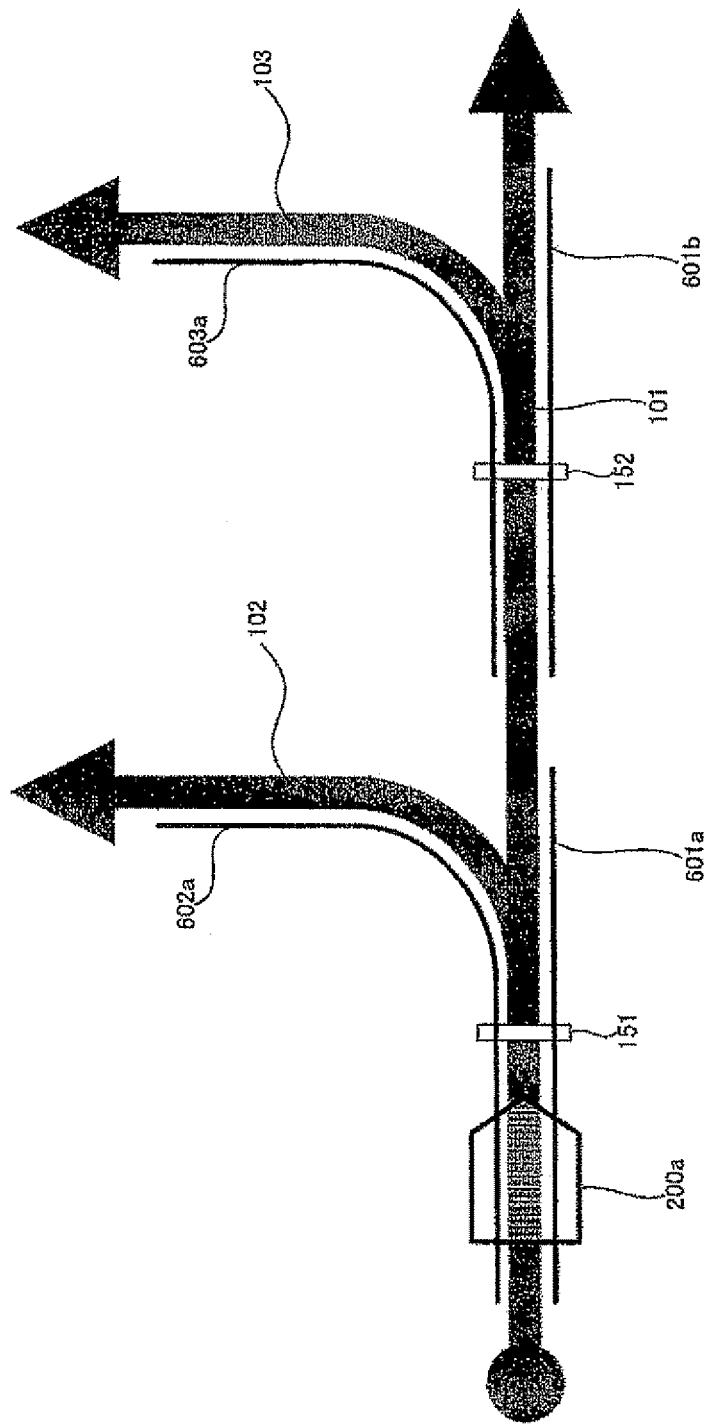
FIG. 9 is a conceptual diagram showing a structure of a guidepath wire and an operation of an vehicle according to comparative example 1.
Figure 10:
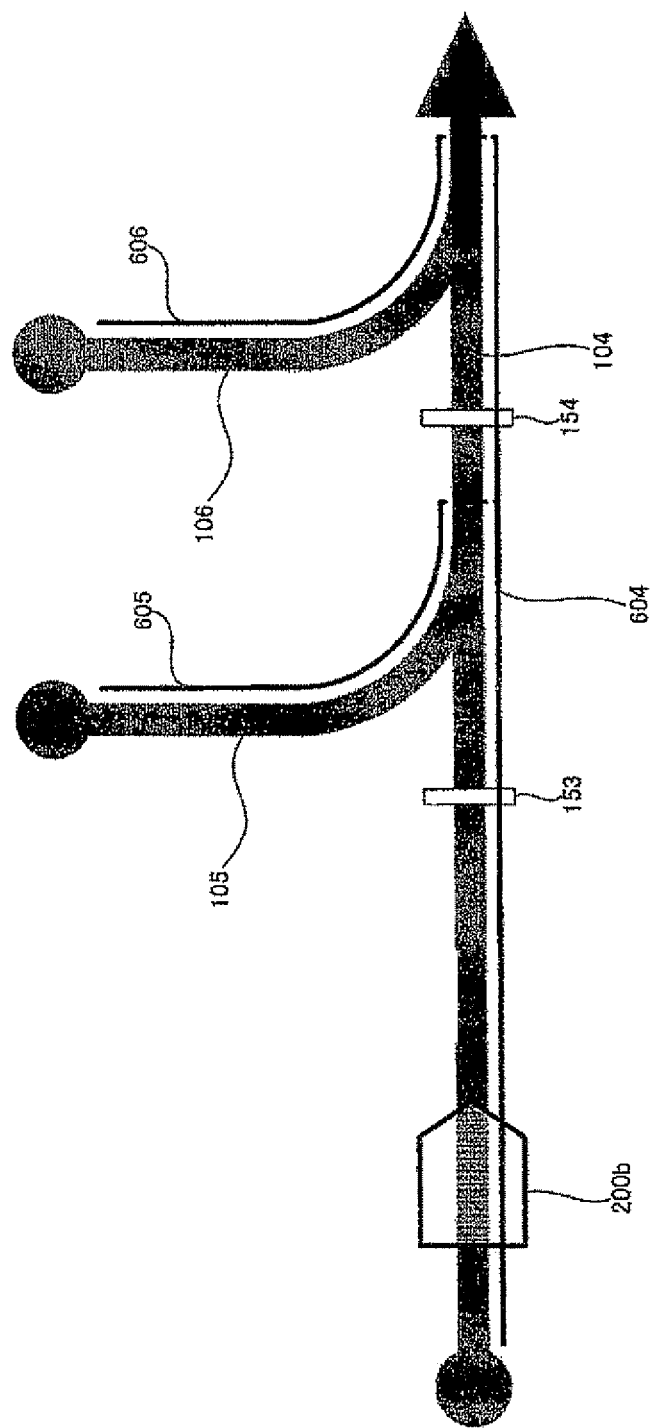
FIG. 10 is a conceptual diagram showing a structure of a guidepath wire and an operation of a vehicle according to example 2.
Figure 11:
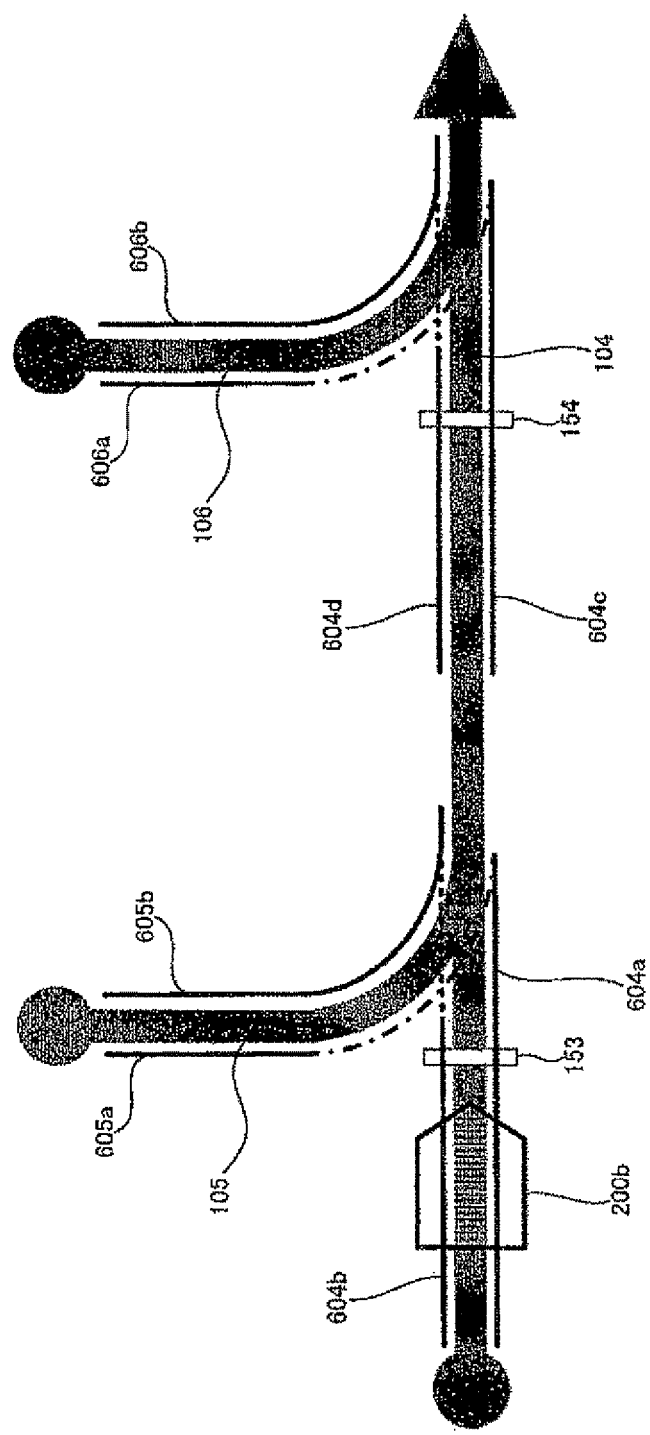
FIG. 11 is a conceptual diagram showing a structure of a guidepath wire and an operation of a vehicle according to comparative example 2.
Figure 12:
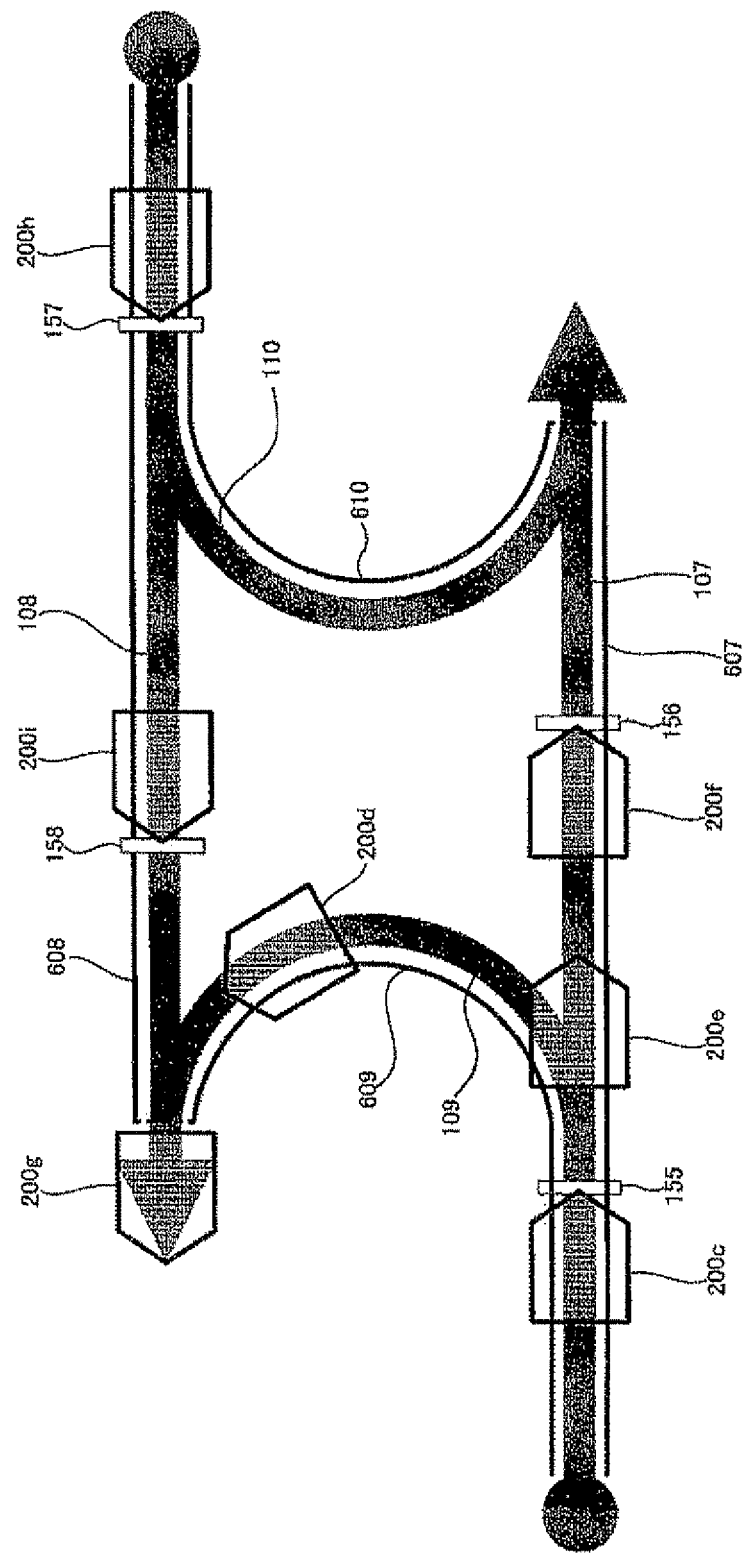
FIG. 12 is a conceptual diagram showing a structure of a guidepath wire and an operation of a vehicle according to example 3.
Figure 13:
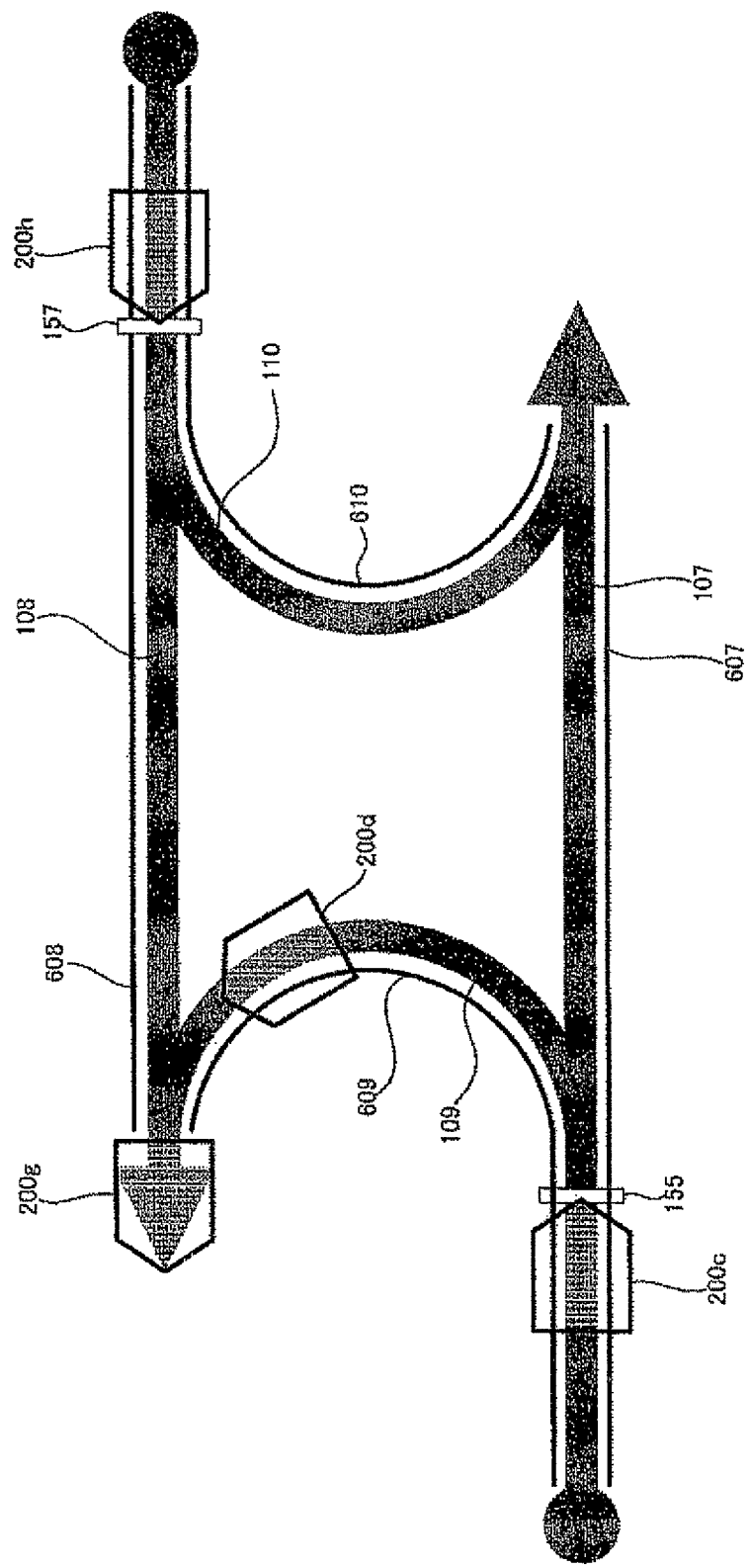
FIG. 13 is a conceptual diagram showing a structure of a guidepath wire and an operation of a vehicle according to comparative example 3.

(4) Position of a Guidepath Wire in a Divergence Point and a Merge Point and Operation of a Vehicle Next, the position of the guidepath wire in the divergence point and the merge point the operation of the vehicle will be explained, referring to FIGS. 8 through 13. FIG. 8 is a conceptual diagram showing the structure of the guidepath wire and the operation of the vehicle 200a according to example 1. FIG. 9 is a conceptual diagram showing the structure of the guidepath wire and the operation of the vehicle 200a according to comparative example 1. FIG. 10 is a conceptual diagram showing the structure of the guidepath wire and the operation of the vehicle 200b according to example 2. FIG. 11 is a conceptual diagram showing the structure of the guidepath wire and the operation of the vehicle 200b according to comparative example 2. FIG. 12 is a conceptual diagram showing the structure of the guidepath wire and the operation of the vehicle 200c according to example 3. FIG. 13 is a conceptual diagram showing the structure of the guidepath wire and the operation of the vehicle 200c according to comparative example 3.

(4-1) Example 1

First, the case where the rail includes a main rail 101, a first divergence rail 102 diverged from the main rail 101, and a second divergence rail 103 as shown in FIG. 8 will be explained.

At the right side of the main rail 101, a guidepath wire 601 is arranged so as to extend to the divergence point with the first divergence rail 102 and the divergence point with the second divergence rail 103. In addition, a guidepath wire 602 is arranged at the left side of the first divergence rail 102 and a guidepath wire 603 is arranged at the left side of the second divergence rail 103. Here, the guidepath wires 601, 602, and 603 are electrically connected to each other. It should be noted that each of stop marks 151 and 152 is arranged at each of the divergence points.

A vehicle 200a travelling on the main rail 101 can recognize the existence of other vehicles 200 at the first divergence rail 102 and the second divergence rail 103 by communication using the guidepath wire 601. Therefore, when other vehicles exist neither on the first divergence rail 102 nor on the second divergence rail 103, the vehicle 200a can move straight on the main rail 101 without slowing down. On the other hand, when other vehicles 200 exist on the first divergence rail 102, the vehicle 200a is controlled so as to stop at the stop mark 151. In addition, when other vehicles do not exist on the first divergence rail 102 but on the second divergence rail 103, the vehicle 200a is controlled so as to stop at the stop mark 152.

However, a vehicle 200a does not necessarily stop when other vehicles 200 exist on the first divergence rail 102 and the second divergence 103. It is acceptable that the vehicle 200a moves straight on the divergence points without slowing down while instructing other vehicles 200 to slow down or stop, by sending a signal that notifies the other vehicles 200 of the existence of the vehicle 200a.

More specifically, for example, the case where it is set that the vehicle 200 travelling from the main rail 101 to the first divergence rail 102 transmits the signal F1, the vehicle 200 travelling from the main rail 101 to the second divergence rail 103 transmits the signal F2, and the vehicle 200 moving straight without divergence transmits the signal F3 will be considered.

In this case, when the following vehicle travelling straight (namely, the vehicle travelling after the vehicle 200 transmitting a signal) does not receive the signal F1 or F2, the following vehicle determines that other vehicles 200 do not exist in the area of the same travelling direction and continues travelling without preparing to stop (namely, slowing down) at the stop marks 151 and 152. Then, as long as the front monitoring sensor does not detect the preceding vehicle, the following vehicle can enter to the divergence point with the first divergence rail 102 and the divergence point with the second divergence rail 103 without slowing down. Furthermore, if the following vehicle does not receive the signal F3 when the following vehicle travels from the main rail 101 to the first divergence rail 102, the following vehicle also determines that other vehicles 200 do not exist in the area of the same travelling direction and continues travelling without preparing to stop at the stop marks 151 and 152.

(4-2) Comparative Example 1

Here referring to FIG. 9, it is assumed that the vehicles 200 can receive only one signal (namely, a signal with a single frequency). In this case, the guidepath wire 601 arranged along the main rail 101 includes two independent guidepath wires, the guidepath wire 601a that corresponds to the divergence point with the first divergence rail 102 and the guidepath wire 601b that corresponds to the divergence point with the second divergence rail 103.

When the guidepath wire 601a and the guidepath wire 601b are independent from each other, the vehicle 200a travelling in the guidepath wire area of the guidepath wire 601a, for example, cannot recognize the existence of other vehicles 200 in the guidepath wire area of the guidepath wire 601b. Thus, when the vehicle 200a is about to enter to the guidepath wire area of the guidepath wire 601b, the vehicle 200a is required to slow down so as to stop certainly at the stop mark 152 in the case where other preceding vehicles 200 exist.

As described above, if the vehicle 200 can receive only one signal, each vehicle 200 is required to unnecessarily slow down when the divergence points continuously exist. As a result, the technical problem of lowering conveying efficiency occurs.

(4-3) Comparison Between Example 1 and Comparative Example 1

As shown from the comparison between FIG. 8 and FIG. 9, the interval between the divergence points of FIG. 9 is broader than that of FIG. 8. This is due to the fact that, in the case shown in FIG. 9, the vehicle 200a which is about to reach the divergence point from the main rail 101 with the first divergence rail 102 cannot recognize the existence of other vehicles 200 at the divergence point from the main rail 101 to the second divergence rail 103.

Specifically, when other vehicles 200 do not exist on the first divergence rail 102 as shown in FIG. 9, the vehicle 200a can move straight on to the divergence point with the first divergence rail 102 without slowing down. However, since the existence of other vehicles 200 at the divergence point with the second divergence rail 103 cannot be recognized at this point, even if other vehicles 200 do not exist on the second divergence rail 103, the vehicle 200a is required to slow down enough to stop in front of the stop mark 152. Such travelling control cannot be performed if the interval between the divergence points is narrow as shown in FIG. 8. In other words, the divergence points arranged with a narrower interval as shown in FIG. 8 can be realized because the vehicle 200 can receive and send a plurality of signals.

(4-4) Example 2

Next, the case where the rail includes a main rail 104, a first merge rail 105 and a second merge rail 106 that is merged into the main rail 104 as shown in FIG. 10 will be considered.

At the right side of the main rail 104, a guidepath wire 604 is arranged so as to extend to the merge point with the first merge rail 105 and to the merge point with the second merge rail 106. In addition, a guidepath wire 605 is arranged at the left side of the first merge rail 105, and a guidepath wire 606 is arranged at the left side of the second merge rail 106. Here, the guidepath wires 604, 605, and 606 are electrically connected to each other. Each of stop marks 153 and 154 is arranged in front of each merge point.

A vehicle 200b travelling on the main rail 104 can recognize the existence of other vehicles on the first merge rail 105 and the second merge rail 106 by communication using the guidepath wire 604. Therefore, when other vehicles 200 exist neither on the first merge rail 105 nor on the second merge rail 106, the vehicle 200b can move straight on the main rail 104 without slowing down. On the other hand, when other vehicles 200 exist on the first merge rail 105, the vehicle 200b is controlled so as to stop at the stop mark 153. In addition, when other vehicles 200 do not exist on the first merge rail 105 but on the second merge rail 106, the vehicle 200b is controlled so as to stop at the stop mark 154.

However, a vehicle 200b does not necessarily stop when other vehicles 200 exist on the first merge rail 105 and the second merge rail 106. It is acceptable that the vehicle 200b moves straight on the merge points without slowing down while instructing other vehicles 200 to slow down or stop, by sending a signal that notifies the other vehicles 200 of the existence of the vehicle 200b.

(4-5) Comparative Example 2

Here referring to FIG. 11, as explained in FIG. 9, it is assumed that the vehicle 200 can receive only one signal. In this case, the guidepath wires 600 should be arranged at the both sides of the rail and each of the guidepath wires 600 along the main rail 104 is arranged in each of the merge points with each of the merge rails.

Specifically, guidepath wires 604a and 604b are arranged around the merge point of the main rail 104 with the first merge rail 105, and guidepath wires 604c and 604d are arranged around the merge point with the second merge rail 106. In addition, guidepath wires 605a and 605b are arranged in the first merge rail 105 and guidepath wires 606a and 606b are arranged in the second merge rail 106. The guidepath wire 604a and the guidepath wire 605a are electrically connected to each other, and the guidepath wire 604b and the guidepath wire 605b are electrically connected to each other. In addition, the guidepath wire 604c and the guidepath wire 606a are electrically connected to each other, and the guidepath wire 604d and the guidepath wire 606b are electrically connected to each other.

As described above, if the vehicle 200 can receive only one signal, since a plurality of information cannot be shared with one guidepath wire 600, the number of the guidepath wires 600 increases as a result. Consequently, the structure of the system becomes complicated and the cost for the system increases.

(4-6) Comparison Between Example 2 and Comparative Example 2

As shown from the comparison between FIG. 10 and FIG. 11, the interval between the merge points of FIG. 11 is broader than that of FIG. 10. This is due to the fact that, in the case shown in FIG. 11, the vehicle 200b which is about to reach the merge point between the main rail 104 and the first merge rail 105 cannot recognize the existence of other vehicles 200 at the merge point between the main rail 104 and the second merge rail 106.

Specifically, when other vehicles 200 do not exist on the first merge rail 105 as shown in FIG. 11, the vehicle 200b can move straight on the merge point to the first merge rail 105 without slowing down. However, since the existence of other vehicles 200 at the merge point to the second merge rail 106 cannot be recognized at this point, even if other vehicles 200 do not exist on the second merge rail 106, the vehicle 200b is required to slow down enough to avoid colliding in front of the merge point to the second merge rail 106. Such travelling control cannot be performed if the interval between the merge points is narrow as shown in FIG. 10. In other words, the merge points arranged with a narrower interval as shown in FIG. 10 can be realized because the vehicle 200 can receive and send a plurality of signals.

(4-7) Example 3

Next, the case where the rail includes a first rail 107, a second rail 108, and a first connecting rail 109 and a second connecting rail 110 that connects between the first rail 107 and the second rail 108, as shown in FIG. 12, will be considered.

At the right side of the first rail 107, a guidepath wire 607 is arranged so as to extend from the divergence point with the first connecting rail 109 to the merge point with the second connecting rail 110. At the right side of the second rail 108, a guidepath wire 608 is also arranged so as to extend from the divergence point with the second connecting rail 110 to the merge point with the first connecting rail 109. In addition, at the left side of the first rail 107, a guidepath wire 609 is arranged so as to extend to the first connecting rail 109. At the left side of the second rail 108, a guidepath wire 610 is also arranged so as to extend to the second connecting rail 110. Here, the guidepath wire 607 and the guidepath wire 610 are electrically connected to each other. The guidepath wire 608 and the guidepath wire 609 are also electrically connected to each other. The guidepath wires 607 and 610 and the guidepath wires 608 and 609 are not electrically connected (namely, insulated).

In front of the divergence point of the first connecting rail 109 from the first rail 107, a stop mark 155 is arranged. In front of the merge point of the second connecting rail 110 with the first rail 107, a stop mark 156 is arranged. In front of the divergence point of the second connecting rail 110 from the second rail 108, a stop mark 157 is arranged. In front of the merge point of the first connecting rail 109 with the second rail 108, a stop mark 158 is arranged.

Here, a vehicle 200c at the point of the stop mark 155 can recognize the existence of other vehicles (for example, a vehicle 200e, a vehicle 200f, and etc.) in the area until the merge point of the first rail 107 with the second connecting rail 110 and in the second rail 108, by communication using the guidepath wire 607. The vehicle 200c can further recognize the existence of other vehicles (for example, a vehicle 200d, a vehicle 200i, and etc.) in the first connecting rail 109 and in the second rail 108. It should be noted that the reason why the existence of other vehicles can be recognized in such a very wide range is because the vehicles 200 can communicate with each other using a plurality of the signals F1 through F4 each having different frequencies from the others (namely, because a plurality of information can be transmitted with one guidepath wire 600).

If the existence of other vehicles 200 can be recognized as described above, it is possible to avoid lowering the travelling efficiency of the vehicle 200c at the divergence point and the merge point. In other words, the preferable travelling can be realized while avoiding colliding with other vehicles 200. Specifically, when the vehicle 200c is about to move straight on the divergence point from the first rail 107 to the first connecting rail 109, even if the vehicle 200d exists on the first connecting rail 109, the vehicle 200c can continue travelling without slowing down.

(4-8) Comparative Example 3

Here, as explained in FIG. 9 and FIG. 11, the case where the vehicle 200 can send and receive only one signal will be considered, referring to FIG. 13. If the vehicle 200 can send and receive only one signal, the structure of the guidepath wire 600 in the rail has to be changed. Specifically, the guidepath wire 607 and the guidepath wire 610 are configured so as not to be electrically connected to each other. In addition, the guidepath wire 608 and the guidepath wire 609 are configured as so not to be electrically connected to each other.

In the above structure, the vehicle 200c existing at the point of the stop mark 155 can recognize the existence of the vehicle 200d on the first connecting rail 109. However, since the vehicle 200e can send and receive only one signal, the vehicle 200c cannot communicate using the guidepath wire 607 until the vehicle 200c recognizes the existence of the vehicle 200d. In other words, the existence of other vehicles 200 on the first rail 107 cannot be recognized. Therefore, when the vehicle 200c is about to move straight on to the divergence point of the first connecting rail 109 from the first rail 107, even if other vehicles do not exist on the first rail 107, the vehicle 200c cannot start moving straight until the vehicle 200d moves to the position of the vehicle 200g (namely, outside the area where the guidepath wire 609 is arranged). Therefore, the travelling efficiency of the vehicle 200c in FIG. 13 is drastically lowered compared with the case shown in FIG. 12.

(4-9) Comparison Between the Examples and Comparative Examples

Compared with the above-described comparative examples shown in FIG. 9, FIG. 11, and FIG. 13, with the rail guided vehicle systems according to the embodiments shown in FIG. 8, FIG. 10, and FIG. 12, unnecessary slowing down and stopping of the vehicle 200 travelling on the divergence point and the merge point can be avoided, since the vehicle 200 is configured to send and receive a plurality of signals each having different frequencies from the others, even if the divergence points and the merge points are continuously arranged in the rail. Therefore, it is possible to effectively increase the conveying efficiency of the system.

(5) Other Embodiments

The present invention is not limited to the above-described embodiments and can be changed within the scope of the invention that can be understood from whole of the claims and the specification and the rail guided vehicle system that includes such change is also within the scope of the invention.

Specifically, a plurality of the embodiments and the modifications described in the specification can be arbitrarily combined as required.

What is claimed is:

1. A rail guided vehicle system comprising a rail having a guidepath wire in a predetermined area including a divergence point and a merge point and a plurality of vehicles that travel while being supported and guided by the rail, each of the vehicles comprising:
   a generating unit configured to generate a plurality of signals, each of the plurality of signals having different frequencies from the others;
   a transmitting unit configured to transmit each of the plurality of signals generated by the generating unit to the guidepath wire;
   a receiving unit configured to receive each of the plurality of signals transmitted via the guidepath wire;
   a determining unit configured to determine, based on a frequency of the signal received by the receiving unit, whether the vehicle is to be slowed down, or stopped, or kept travelling; and
   a controlling unit configured to control the vehicle in accordance with a result of a determination determined by the determining unit, wherein
   a signal having an inherent and different frequency is allocated to each divergence point and merge point, and
   when the vehicle passes through a particular divergence point or merge point, the generating unit is configured to generate the signal having the frequency that is inherent to that particular divergence point or merge point.

2. The rail guided vehicle system according to claim 1, wherein the receiving unit is arranged at a front end side of the vehicle and the transmitting unit is arranged at a back end side of the vehicle.

3. The rail guided vehicle system according to claim 2, wherein
   the guidepath wire is arranged along at least one of a right side frame and a left side frame of the rail;
   the receiving unit includes a first receiving unit arranged at a right-front end side of the vehicle and a second receiving unit arranged at a left-front end side of the vehicle; and
   the transmitting unit includes a first transmitting unit arranged at the right-back end side of the vehicle and a second transmitting unit arranged at the left-back end side of the vehicle.

4. The rail guided vehicle system according to claim 3, wherein
   the generating unit is configured to generate an emergency stop signal as one of the plurality of signals;
   the determining unit is configured to determine, when the receiving unit receives the emergency stop signal, that the vehicle is to be brought to an emergency stop; and
   the controlling unit is configured to control, when it is determined that the vehicle is to be brought to the emergency stop, the vehicle so as to bring the vehicle to the emergency stop.

5. The rail guided vehicle system according to claim 2, wherein
   the generating unit is configured to generate an emergency stop signal as one of the plurality of signals;
   the determining unit is configured to determine, when the receiving unit receives the emergency stop signal, that the vehicle is brought to an emergency stop; and
   the controlling unit is configured to control, when it is determined that the vehicle is brought to the emergency stop, the vehicle to be brought to the emergency stop.

6. The rail guided vehicle system according to claim 1, wherein the receiving unit is arranged at a front end side of the vehicle and the transmitting unit is arranged at a back end side of the vehicle.

7. The rail guided vehicle system according to claim 6, wherein
   the guidepath wire is arranged along at least one of a right side frame and a left side frame of the rail;
   the receiving unit includes a first receiving unit arranged at a right-front end side of the vehicle and a second receiving unit arranged at a left-front end side of the vehicle; and
   the transmitting unit includes a first transmitting unit arranged at the right-back end side of the vehicle and a second transmitting unit arranged at the left-back end side of the vehicle.

8. The rail guided vehicle system according to claim 7, wherein
   the generating unit is configured to generate an emergency stop signal as one of the plurality of signals;
   the determining unit is configured to determine, when the receiving unit receives the emergency stop signal, that the vehicle is brought to an emergency stop; and
   the controlling unit is configured to control, when it is determined that the vehicle is brought to the emergency stop, the vehicle to be brought to the emergency stop.

9. The rail guided vehicle system according to claim 6, wherein
   the generating unit is configured to generate an emergency stop signal as one of the plurality of signals;
   the determining unit is configured to determine, when the receiving unit receives the emergency stop signal, that the vehicle is brought to an emergency stop; and
   the controlling unit is configured to control, when it is determined that the vehicle is brought to the emergency stop, the vehicle to be brought to the emergency stop.

10. The rail guided vehicle system according to claim 1, wherein
    the generating unit is configured to generate an emergency stop signal as one of the plurality of signals;
    the determining unit is configured to determine, when the receiving unit receives the emergency stop signal, that the vehicle is brought to an emergency stop; and
    the controlling unit is configured to control, when it is determined that the vehicle is brought to the emergency stop, the vehicle to be brought to the emergency stop.

* * * * *